United States Patent [19]

Henning et al.

[11] 3,798,080

[45] Mar. 19, 1974

[54] METHOD OF PRODUCING A SEMICONDUCTOR COMPONENT

[75] Inventors: Wolfgang Henning; Konstantin Von Hoerschelmann; Ingo Kruger; Herbert Weidlich, all of Munich, Germany

[73] Assignee: Siemens Aktiengesellschaft, Berlin and Munich, Germany

[22] Filed: Apr. 22, 1971

[21] Appl. No.: 136,341

[30] Foreign Application Priority Data

Apr. 27, 1970 Germany ........................... 2020531

[52] U.S. Cl. ................................ 148/187, 317/235

[51] Int. Cl. ............................................. H01l 7/44

[58] Field of Search ........... 148/DIG. 1–DIG. 5, 187

[56] References Cited

UNITED STATES PATENTS

| | | | |
|---|---|---|---|
| 3,615,940 | 10/1971 | Kang | 148/187 |
| 3,477,886 | 11/1969 | Ehlenberger | 148/187 |
| 3,475,234 | 10/1969 | Kerwin et al. | 148/187 |
| 3,597,667 | 8/1971 | Horn | 317/235 |

OTHER PUBLICATIONS

Dhaka et al. "Masking Technique", IBM Tech. Disc. Bull., Vol. 11, Dec. 1968, pp. 864, 865.

*Primary Examiner*—Hyland Bizot
*Assistant Examiner*—J. M. Davis
*Attorney, Agent, or Firm*—Curt M. Avery; Arthur E. Wilfond; Herbert L. Lerner

[57] ABSTRACT

In producing a semiconductor component, the use of a silicon nitride layer as an etching stencil, provides an exact positioning of various windows, relative one another, in a silicon dioxide layer, arranged on a semiconductor body. The method is particularly suitable for producing high-frequency transistors of comb structure in planar technology.

2 Claims, 10 Drawing Figures

METHOD OF PRODUCING A SEMICONDUCTOR COMPONENT

Figure 1:
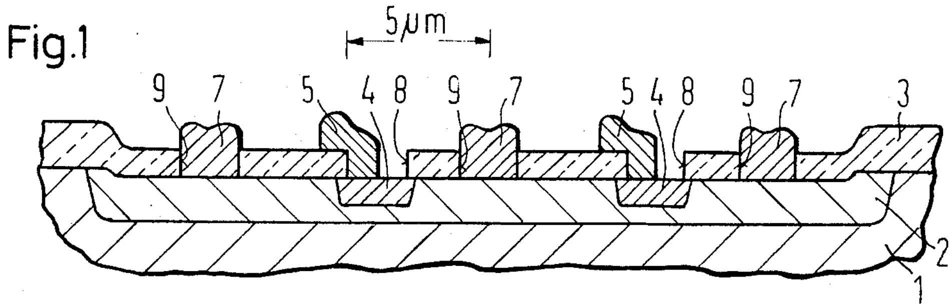

The invention relates to a method of producing a highly heat resistant stencil for the exact positioning of at least two windows, relative one another, in a first masking layer, arranged on a semiconductor body, whereby at least two windows lead to different semiconductor regions.

Methods known from the planar technique are characterized by the fact that two independent photo processes must be effected for producing the emitter zone and the base contact hole. This is irrelevant in larger components or transistors, since at the present time the art provides an exactness of about 1$\mu$, during the adjustment of both masks, that are required for the indicated processes.

The smallest possible components are needed primarily for use in integrated circuits. Highest frequency transistors have comb structures, wherein the strip-like emitter zones and the subordinated contacts should be positioned as close as possible to the strip-like base contacts. In this manner, the largest possible emitter lengths should be obtained with minimal base areas. The desired small base resistance is obtained when, at otherwise equal conditions, for example diffusions, the emitter strips are made narrow and the distance between the strips is made as small as possible.

If the exactness in such components is desired to be in the order of magnitude of less than one $\mu$, then the use of the aforementioned known method results in components afflicted with shortcomings. These shortcomings may constitute a higher base resistance with faulty or insufficient contacting and are caused through an inaccurate adjusting of individual masks, with respect to each other.

It is an object of the present invention to effect the most exact positioning of different windows in a masking layer. Particularly, the above-described emitter zones and base contact holes should be positioned with best possible exactness, relative each other.

To this end and in accordance with the invention, we provide the first masking layer with at least one other masking layer. All desired windows are installed at the same time into the other masking layer and windows are selectively installed through the other, thus structured, masking layer which serves as a stencil, into the first masking layer.

According to our invention, the structures which require great exactness are preferably produced with the aid of one mask, namely the second masking layer. This mask functions as a highly heat resistant stencil through which the individual structures are etched into the first masking layer, by providing the respective, nondesired structures with a varnish (resist) layer. This achieves an exact positioning relative one another of the structures requiring a great degree of exactness.

Another feature of the invention is that following the production of at least one window in the first masking layer, the semiconductor body is preferably doped through this window and after this window is covered, the remaining windows are opened to the semiconductor body, through said first masking layer.

Still another feature of the invention is a silicon dioxide layer to be applied upon the semiconductor body, as a first masking layer and a silicon nitride layer to be applied thereover as an additional masking layer.

Silicon nitride has the characteristic which must be demanded by the aforementioned stencil, if silicon dioxide is used as a first masking layer. Silicon nitride cannot be etched in hydrofluoric acid which etches the silicon dioxide, while hot phosphoric acid, which is used to etch the silicon nitride layer, does not attack silicon dioxide. Furthermore, silicon nitride remains constant at high temperature processes, which must be carried out in diffusion furnaces or during oxidation.

Silicon nitride may be produced in a thin, well-adhering layer on silicon dioxide. The temperature required therefor is so low that the further diffusion of dopants already installed into the semiconductor body, is negligible. Also, the density of a silicon nitride layer is sufficiently low, so that no disturbing surface influences issue therefrom. It is preferable that the stencil of silicon nitride acts as a passivating layer upon the component.

A preferable layer thickness for the silicon nitride layer is about 0.1$\mu$. The silicon dioxide layer must be at least so thick that it acts as a mask at the provided diffusions. Particularly preferable is a thickness around 0.2$\mu$ and somewhat above.

Other features and specifics of the invention will be derived from the following disclosure of an embodiment, as seen in the drawing, wherein:

FIG. 1 is a section through a high frequency transistor which was produced according to the prior art method with inexact adjustment of the masks; and FIGS. 2 to 10 are the individual steps for producing a high frequency transistor according to the present invention.

In FIG. 1 an n-doped semiconductor body 1 partially encloses a region or zone 2 which is partially doped with boron and is p-conducting. The surface of this arrangement is partially covered by a silicon dioxide layer 3 which contains individual windows 8 and contact holes 9. Contact strips 5 serve for contacting the phosphorus doped emitter regions 4, while contact strips 7 contact zone 2 which acts as a base.

As a result of an improper or faulty adjustment of the masks to each other, the windows 8 for the emitter areas 4 in FIG. 1 are placed 1$\mu$ too far to the right into the silicon dioxide layer 3. As a result, the contact strips 7 form zone 2, which acts as the base, are twice as far removed on one side of the emitter region 4, as on the other side. This produces an irregular control of the emitter regions 4 and therefore an earlier regulation and a higher base resistance than in the symmetric case. Furthermore, the contact strips 5 of the emitter regions 4 do not cover the same completely. This causes higher contact resistances than when complete covering is present.

If these errors which entail electrical shortcomings, are to be minimized, then very low adjustment tolerances are required during the production of windows 8, for the emitter regions 4 and of contact holes 9, for the base contact strips 7. However, this considerably limits the yield.

The method of the invention is described in greater detail below, as seen in FIGS. 2 to 10:

An approximately 0.2$\mu$ thick silicon dioxide layer 13 is applied over zone 11 on an *n*-conductive semiconductor body 10 containing a boron-doped zone 11. This silicon dioxide layer 13 was coated with an approximately 0.1$\mu$ thick silicon nitride layer 15 and the latter was coated with a pyrolytic oxide layer 17, also about 0.1$\mu$ thick (FIG. 2).

Figure 2:
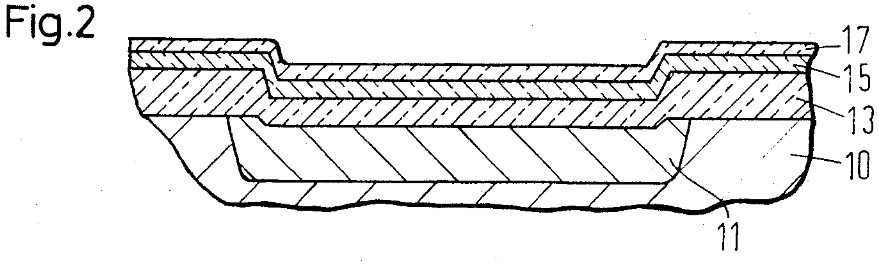
Figure 3:
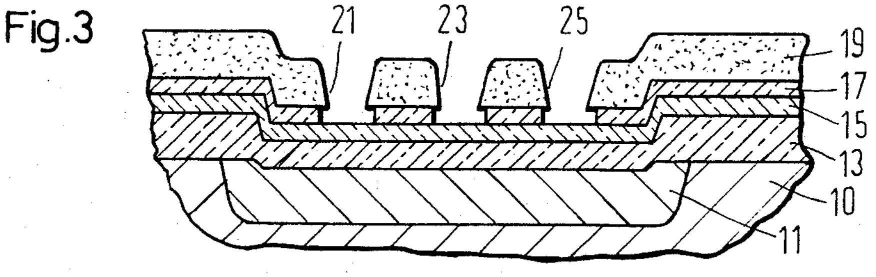

The device shown in FIG. 2 was provided with a photosensitive resist layer 19 whereinto strip-like holes 21, 23, 25 are installed through exposure and development, using the photo technique. Etching with hydrofluoric acid deepened the holes 21, 23, 25 through the oxide layer 17, up to the silicon nitride layer 15. Hydrofluoric acid does not attack the silicon nitride layer 15 (FIG. 3).

Figure 4:
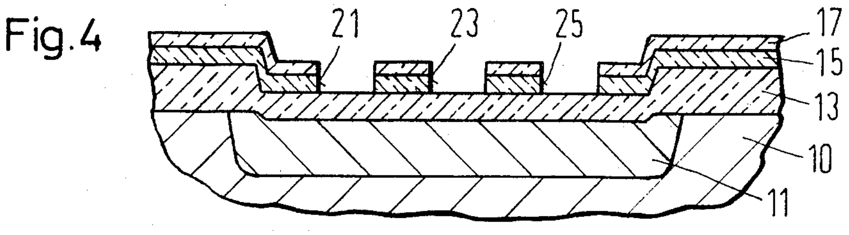

The resist layer 19 was removed by rinsing. Thereafter, the holes 21, 23, 25 were deepened by etching with hot phosphoric acid, up to the silicon dioxide layer 13. The hot phosphoric acid does not attack the silicon dioxide layer 13, during this process where the pyrolytic oxide layer 17 serves as a mask (FIG. 4).

Figure 5:
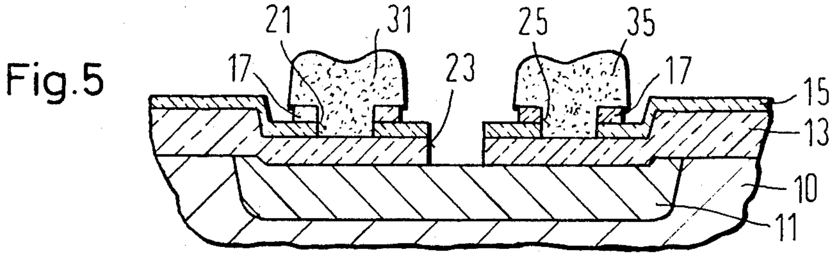

The surface of the device, shown in FIG. 4 was again provided with a light-sensitive resist layer. The latter was removed by exposure and development so that only the holes 21, 25 remained covered resist layers 31, 25. Hole 23 was then deepened by etching with hydrofluoric acid up to zone 11. The exposed portions of the pyrolytic oxide layer 17 were etched away at the same time (FIG. 5).

The resist layers 31, 35 were removed. An emitter region 37, doped with phosphorus was installed by diffusion below the hole 23, into zone 11. A phosphorus glass layer 39 developed by diffusion on the surface of the emitter region 37 (FIG. 6).

Figure 6:
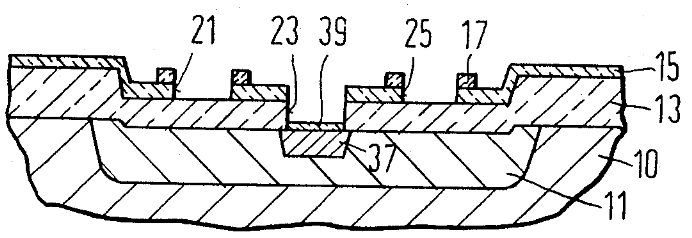
Figure 7:
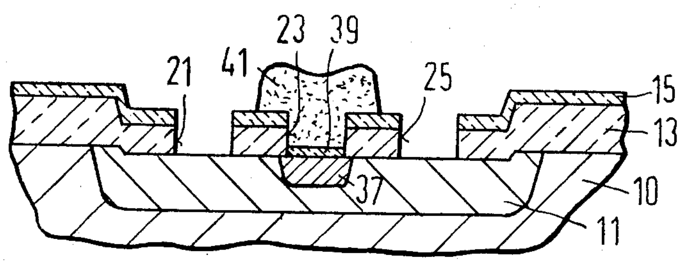

The device illustrated in FIG. 6 was once more provided with a photo sensitive resist layer. As a result of exposure and development, only the hole 23 remained covered by resist layer 41. The holes 21, 25 were then deepened by etching with hydrofluroic acid up to zone 11. At the same time, the remaining portions of the pyrolytic layer 17 were etched away with hydrofluoric acid (FIG. 7).

The resist layer 41 was removed. The phosphorus glass layer 39 was peeled off by total area overetching of the surface in hydrofluoric acid (FIG. 8).

Figure 8:
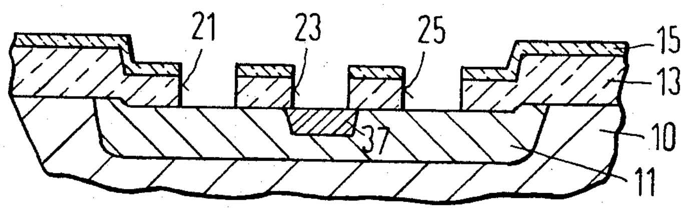

The device illustrated in FIG. 8 was vaporized with an aluminum layer 43. Thereafter, a photo sensitive resist layer 45 was placed upon the aluminum layer 43, the resist layer 45 being shown in FIG. 9 in broken line. With the aid of the photo technique, the resist layer 45 was partially removed so that only resist remnants 51, 53, 55 (FIG. 9) remain over the holes 21, 23, 25 and above the desired connecting paths or contact spots, which are not shown in the FIGS.

Figure 9:
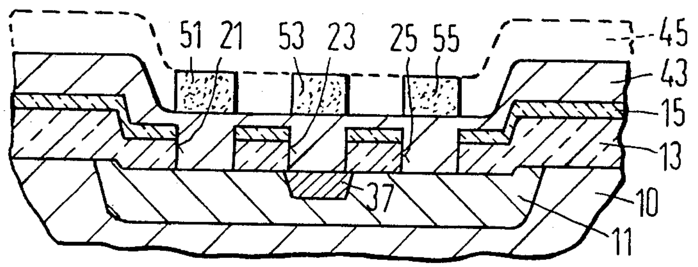
Figure 10:
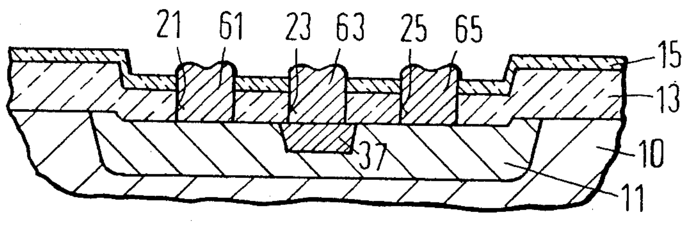

The parts of the aluminum layer 43 which were exposed in FIG. 9 were etched off and the resist remnants 51, 53, 55 were removed so that only the aluminum contact strips 61, 63, 65 remain in the contact holes 21, 23, 25 as well as the subordinated (not illustrated) connecting paths or contact spots (FIG. 10).

The indicated method provides the preferable use of the silicon nitride layer 15 as a stencil, at the same time providing an exact positioning of the contact strips 61 and 65 and 63, respectively in contact holes 21 and 25 and 23. This makes the realization of very fine structures possible. These finer structures help to obtain a smaller base surface at an equal emitter edge length. This makes the use of the present invention especially preferable for high-frequency planar transistors in comb structures. Furthermore, the stability of these transistors is increased through the passivating effect of the nitride.

A pnp transistor can be produced in the same manner as was described in the aforegoing, with respect to the production of an npn transistor.

We claim:

1. Method of producing highest frequency silicon planar transistors of comb structure, which comprises the sequence of steps of providing the surface of a zone of one conductance type, constituting a base, which is situated in a semiconductor body of opposite conductance type, constituting a collector, sequentially with a silicon dioxide layer, a silicon nitride layer, a pyrolytic oxide layer and a resist layer, photoetching all desired windows through the resist layer, deepening the windows by etching through the pyrolytic layer with hydrofluoric acid, removing the resist layer, deepening the windows by etching through the silicon nitride layer with hot phosphoric acid, covering the windows with a resist layer, photoetching away the resist layer covering at least one but less than all of the windows, deepening said at least one window by etching through the silicon dioxide layer with hydrofluroric acid, removing the resist layer, diffusing a zone of the opposite conductance type, constituting an emitter, through said at least one window into the zone of the one conductance type, covering the windows with a resist layer, photoetching away the resist layer covering the other windows, deepening said other windows by etching through the silicon dioxide layer with hydrofluoric acid, removing the resist layer, and installing contact metal into the windows.

2. The method of claim 1 wherein the silicon nitride layer is about 0.1$\mu$ thick and the silicon dioxide layer is at least 0.2$\mu$ thick.

* * * * *